(12) United States Patent
Liang et al.

(10) Patent No.: US 10,529,610 B2
(45) Date of Patent: Jan. 7, 2020

(54) APPARATUS AND METHOD FOR TRANSFERRING A SUBSTRATE

(71) Applicant: SHANGHAI MICRO ELECTRONICS EQUIPMENT (GROUP) CO., LTD., Shanghai (CN)

(72) Inventors: Xiao Liang, Shanghai (CN); Yang Li, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 55 days.

(21) Appl. No.: 15/906,478

(22) Filed: Feb. 27, 2018

(65) Prior Publication Data

US 2018/0247840 A1    Aug. 30, 2018

(30) Foreign Application Priority Data

Feb. 28, 2017   (CN) .......................... 2017 1 0115101

(51) Int. Cl.
*H01L 21/677* (2006.01)
*B65G 47/52* (2006.01)
(Continued)

(52) U.S. Cl.
CPC ........ *H01L 21/6779* (2013.01); *B65G 47/525* (2013.01); *B65G 49/065* (2013.01);
(Continued)

(58) Field of Classification Search
CPC .. B65G 47/255; B65G 49/065; B65G 49/066; B65G 49/068; B65G 2249/04;
(Continued)

(56) References Cited

U.S. PATENT DOCUMENTS 7,976,261 B2 * 7/2011 Snodgrass ............ B65G 49/061
                                                198/604
9,051,128 B2 * 6/2015 Guo ..................... B65G 49/064
(Continued)

FOREIGN PATENT DOCUMENTS

CN            1755175 A       4/2006
CN            1817767 A       8/2006
(Continued)

*Primary Examiner* — Gene O Crawford
*Assistant Examiner* — Keith R Campbell
(74) *Attorney, Agent, or Firm* — Muncy, Geissler, Olds & Lowe, P.C.

(57) ABSTRACT

Apparatus and method for transferring a substrate are disclosed. The substrate transfer apparatus includes: a substrate conveyance assembly disposed between a mechanical arm and a wafer stage, the substrate conveyance assembly including a substrate loading conveyor and a substrate unloading conveyor parallelly arranged in a first direction, each of the substrate loading conveyor and the substrate unloading conveyor configured for transferring a substrate between the wafer stage and the mechanical arm along a second direction perpendicular to the first direction; an integral frame; and a transition air suspension assembly fixed to the integral frame at the end thereof proximal to the wafer stage, the transition air suspension assembly being able to engage with either of the substrate loading conveyor and the substrate unloading conveyor for producing an air film to levitate the substrate during the conveyance of the substrate by the substrate loading conveyor or the substrate unloading conveyor.

18 Claims, 5 Drawing Sheets

(51) Int. Cl.
*G03F 7/20* (2006.01)
*B65G 49/06* (2006.01)

(52) U.S. Cl.
CPC ...... *G03F 7/7075* (2013.01); *H01L 21/67706* (2013.01); *H01L 21/67778* (2013.01); *H01L 21/67784* (2013.01); *B65G 49/067* (2013.01); *B65G 2249/04* (2013.01)

(58) Field of Classification Search
CPC ............. B65G 49/064; B65G 49/067; H01L 21/67706; H01L 21/67778; H01L 21/67784; H01L 21/6779; G03F 7/7075
See application file for complete search history.

(56) References Cited

U.S. PATENT DOCUMENTS 9,087,865 B2 * 7/2015 Liu ................... H01L 21/67736

2018/0065816 A1 * 3/2018 Aoki ..................... B65G 49/06
2019/0109028 A1 * 4/2019 Wu ................... H01L 21/67236

FOREIGN PATENT DOCUMENTS

| | | | |
|---|---|---|---|
| CN | 101035725 | A | 9/2007 |
| CN | 201035275 | Y | 3/2008 |
| CN | 101244887 | A | 8/2008 |
| CN | 101562965 | A | 10/2009 |
| CN | 101903269 | A | 12/2010 |
| CN | 102161438 | A | 8/2011 |
| CN | 102320472 | A | 1/2012 |
| CN | 102464210 | A | 5/2012 |
| CN | 103596753 | A | 2/2014 |
| CN | 104749895 | A | 7/2015 |
| CN | 204872885 | U | 12/2015 |
| CN | 105417166 | A | 3/2016 |
| CN | 105905615 | A | 8/2016 |
| CN | 106564757 | A | 4/2017 |
| JP | 2015008334 | A * | 1/2015 ....... H01L 21/67784 |
| TW | M466352 | U | 11/2013 |

* cited by examiner

APPARATUS AND METHOD FOR TRANSFERRING A SUBSTRATE

CROSS-REFERENCES TO RELATED APPLICATIONS

This application claims the priority of Chinese patent application number 201710115101.7, filed on Feb. 28, 2017, the entire contents of which are incorporated herein by reference.

TECHNICAL FIELD

This invention relates to the field of photolithography tools and, in particular, to an apparatus and method for transfer of a substrate.

BACKGROUND

As a key component of a photolithography machine, secure transportability of a substrate conveyor is crucial to the throughput of the machine. Glass substrates are typically transported between a wafer stage and a mechanical arm by a roller conveyor or an air conveyor. With the rapid development of the integrated circuit (IC) manufacturing industry, substrates are expanding in size, imposing increasingly demanding requirements on the conveyors regarding their speed and security performance. The exiting roller and air conveyors are however both associated with a number of deficiencies. Simply using roller conveyors cannot ensure smooth substrate transfer, while simply using air conveyors is expensive and unsuitable for mass production.

SUMMARY OF THE INVENTION

In order to overcome the aforementioned prior-art problems, the present invention provides an apparatus and method for transferring a substrate.

To this end, a substrate transfer apparatus according to the present invention includes: a substrate conveyance assembly disposed between a mechanical arm and a wafer stage, the substrate conveyance assembly including a substrate loading conveyor and a substrate unloading conveyor, the substrate loading conveyor and the substrate unloading conveyor parallelly arranged in a first direction, each of the substrate loading conveyor and the substrate unloading conveyor configured for conveying a substrate between the wafer stage and the mechanical arm along a second direction that is perpendicular to the first direction; an integral frame; and a transition air suspension assembly fixed to the integral frame at an end thereof proximal to the wafer stage, the transition air suspension assembly being able to engage with either of the substrate loading conveyor and the substrate unloading conveyor and configured to produce an air film to levitate the substrate during the conveyance of the substrate by the substrate loading conveyor or the substrate unloading conveyor.

Additionally, the substrate loading conveyor and the substrate unloading conveyor may be fixed relative to each other and in slidable connection with the integral frame.

Additionally, each of the substrate loading conveyor and the substrate unloading conveyor may be provided with a substrate transfer assembly at an end thereof proximal to the mechanical arm.

Additionally, the substrate transfer assembly may include a motion assembly disposed on the integral frame and a plurality of suction cups disposed on the motion assembly, the suction cups being configured for sucking the substrate so that the substrate is able to be moved with the motion assembly in the second direction.

Additionally, the motion assembly may be a motor/screw assembly.

Additionally, each of the substrate loading conveyor and the substrate unloading conveyor may include a substrate guiding assembly and a front-end air suspension assembly, which are disposed along the second direction and are vertically flush with each other.

Additionally, the substrate guiding assembly may include a plurality of parallelly arranged guide roller rows, each of the plurality of guide roller rows including a plurality of guide rollers arranged along the second direction at an interval.

Additionally, the front-end air suspension assembly may be configured for producing another air film to levitate the substrate.

Additionally, each of the substrate loading conveyor and the substrate unloading conveyor may further include a substrate position adjustment assembly interlaced with the substrate guiding assembly.

Additionally, the substrate position adjustment assembly may include a plurality of universal roller ball groups interlaced with the guide roller rows, each of the universal roller ball groups including a plurality of universal roller ball units arranged along the second direction at an interval.

Additionally, each of the universal roller ball units may include a support, a plurality of universal roller balls disposed on the support and a cylinder for driving the support to move vertically.

Additionally, the substrate loading conveyor and the substrate unloading conveyor may further include edge protection assemblies disposed on both sides of the corresponding substrate guiding assembly in the first direction and configured to prevent any shift of the substrate in the first direction.

Additionally, the edge protection assemblies may include a plurality of T-shaped protrusions arranged on both sides of the corresponding substrate guiding assembly in the first direction.

Additionally, the substrate loading conveyor and the substrate unloading conveyor may have a same structure.

The present invention also provides a substrate transfer method for use with the substrate transfer apparatus as defined above. The method includes the steps of:

S1) placing a substrate onto the substrate conveyance assembly by the mechanical arm;

S2) sucking the substrate onto the substrate transfer assembly of the substrate conveyance assembly and conveying the substrate by the substrate transfer assembly toward the wafer stage; and S3) upon the substrate approaching the end of the substrate conveyance assembly proximal to the wafer stage, the transition air suspension assembly producing an air film to levitate the substrate and transferring the substrate by the substrate transfer assembly onto the wafer stage along the second direction.

Additionally, in step S2, the substrate may be sucked onto a plurality of suction cups of the substrate transfer assembly and conveyed by the motion assembly toward the wafer stage, and wherein movement of the substrate drives a plurality of guide rollers of the substrate conveyance assembly to rotate and thereby guide the movement of the substrate.

Additionally, the substrate conveyance assembly may further include a plurality of universal roller ball units arranged along the second direction at an interval, each of the plurality of universal roller ball units including a support, a plurality of universal roller balls disposed on the support and a cylinder for driving the support to move vertically, and wherein the substrate transfer method may further include, between steps S1 and S2, driving the supports of the plurality of universal roller ball units to move upward by the cylinders of the plurality of universal roller ball units so that the substrate is positioned on a plane defined by the plurality of universal roller ball units and adjusted in position and driving the supports to move downward by the cylinders of the plurality of universal roller ball units so that the substrate again resides on the substrate conveyance assembly.

As noted above, the present invention provides a substrate transfer apparatus including a substrate conveyance assembly and a transition air suspension assembly both disposed between a mechanical arm and a wafer stage. The substrate conveyance assembly includes a substrate loading conveyor and a substrate unloading conveyor, which are parallel to each other and both extend in the X-direction. Each of the substrate loading conveyor and the substrate unloading conveyor is provided with a substrate transfer assembly disposed at the end proximal to the mechanical arm. The substrate conveyance assembly and the transition air suspension assembly together form a transfer subsystem that is significantly reduced in cost and capable of efficient, secure transfer of a substrate between the mechanical arm and the wafer stage by virtue of the cooperation between the transition air suspension assembly and guide rollers during transfer of the substrate between the substrate conveyance assembly and the wafer stage.

Figure 1A:
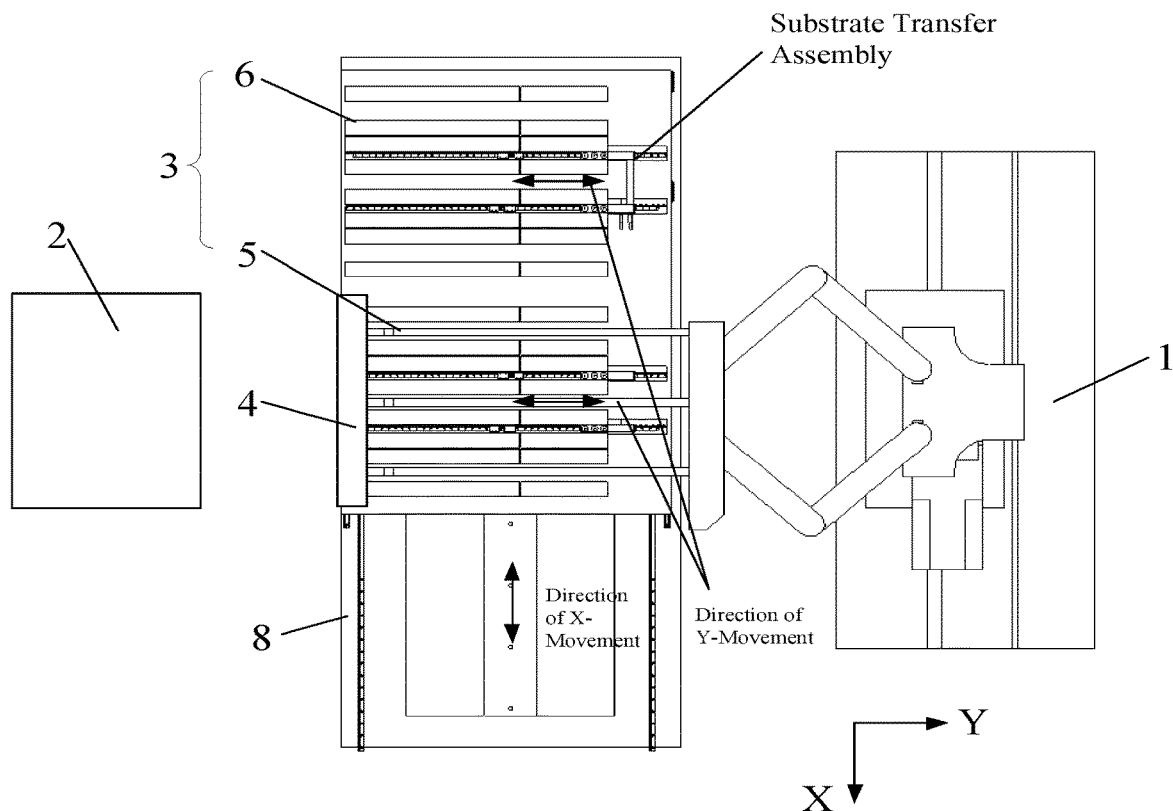
FIG. 1a is a structural schematic diagram of a substrate transfer apparatus according to a first embodiment of the present invention.

In the figures, 1—mechanical arm; 2—wafer stage; 3—substrate conveyance assembly; 4—transition air suspension assembly; 5—substrate loading conveyor; 6—substrate unloading conveyor; 7—substrate; 8—integral frame; 9—substrate guiding assembly; 91—guide roller; 10—front-end air suspension assembly; 11—T-shaped protrusion; 12—universal roller ball unit; 13—support; and 14—universal roller ball.

DETAILED DESCRIPTION OF EXEMPLARY EMBODIMENTS

The present invention will be described below in detail with reference to the accompanying drawings.

Embodiment 1

As shown in FIGS. 1a to 3, the present invention provides a substrate transfer apparatus including a substrate conveyance assembly 3 and a transition air suspension assembly 4 which are disposed between a mechanical arm 1 and a wafer stage 2. The substrate conveyance assembly 3 includes, disposed in parallel along the X-direction, a substrate loading conveyor 5 and a substrate unloading conveyor 6. Each of the substrate loading conveyor 5 and the substrate unloading conveyor 6 is provided, at the end proximal to the mechanical arm 1, with a substrate transfer assembly (as shown in FIG. 1c). Specifically, the substrate loading conveyor 5 and the substrate unloading conveyor 6 are fixed relative to each other so that they are, as a whole, parallel, and in slidable connection, to the integral frame 8. Both the substrate loading conveyor 5 and the substrate unloading conveyor 6 are movable in the X-direction. The substrate loading conveyor 5 is adapted to transfer a substrate 7 from the mechanical arm 1 onto the wafer stage 2, and the substrate unloading conveyor 6 is adapted to transfer a substrate 7 from the wafer stage 2 to the mechanical arm 1. The transition air suspension assembly 4 is fixedly attached to the integral frame 8. The substrate conveyance assembly 3 and the transition air suspension assembly 4 together form a transfer subsystem that is significantly reduced in cost and capable of efficient, secure transfer of the substrate 7 between the mechanical arm 1 and the wafer stage 2.

The substrate loading conveyor 5 and the substrate unloading conveyor 6 may have the same structure. In order to transfer the substrate 7 from the mechanical arm 1 onto the wafer stage 2, the substrate loading conveyor 5 and the substrate unloading conveyor 6 move in synchronization until the substrate loading conveyor 5 reaches a position where it can cooperate with the transition air suspension assembly 4. Similarly, in order to transfer the substrate 7 from the wafer stage 2 onto the mechanical arm 1, the substrate loading conveyor 5 and the substrate unloading conveyor 6 move in synchronization until the substrate unloading conveyor 6 reaches a position where it can cooperate with the transition air suspension assembly 4.

The substrate loading conveyor 5 and the substrate unloading conveyor 6 can move as a whole either by fixation to a single frame or simply by a direct connection via a rod, and the present invention is not limited to any particular connection between them, as long as it can fix them relative to each other.

As the substrate loading conveyor 5 and the substrate unloading conveyor 6 may be structurally identical and operate reversely, the following description is set forth with only the substrate loading conveyor 5 as an example to explain their operations.

Figure 1B:
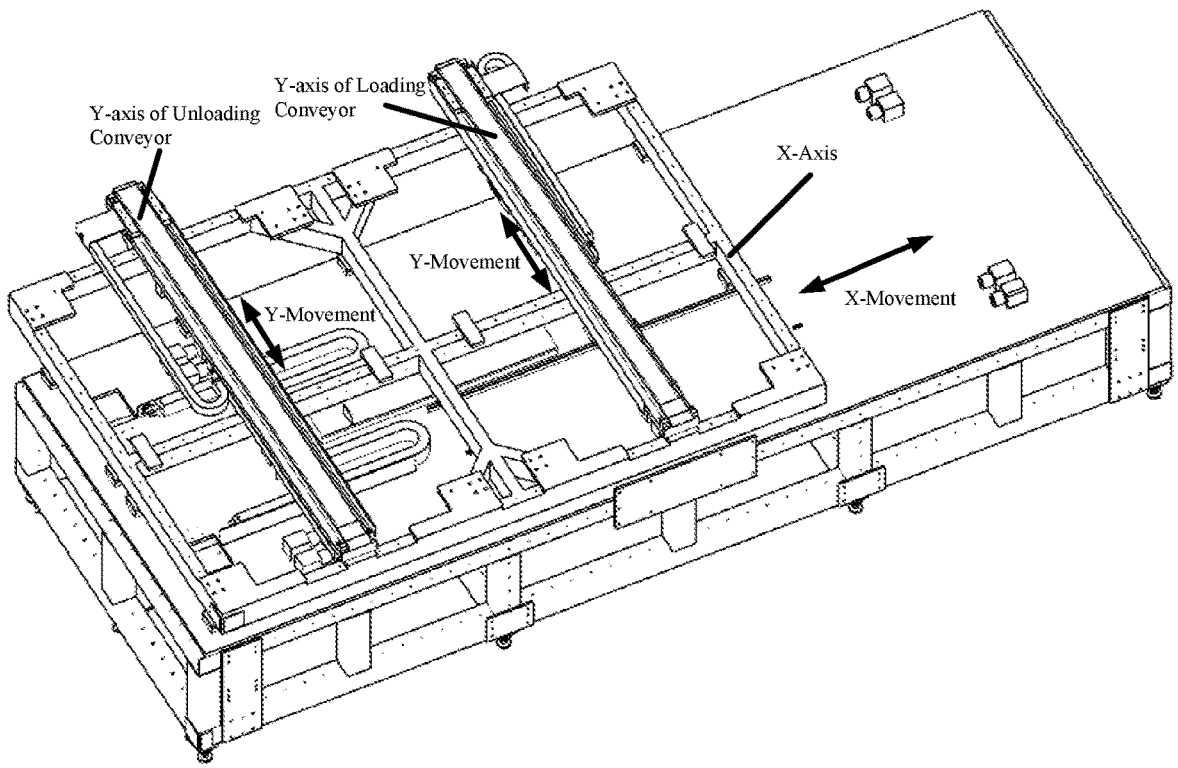
FIG. 1b is a perspective structural schematic diagram of the substrate transfer apparatus according to the first embodiment of the present invention.
Figure 1C:
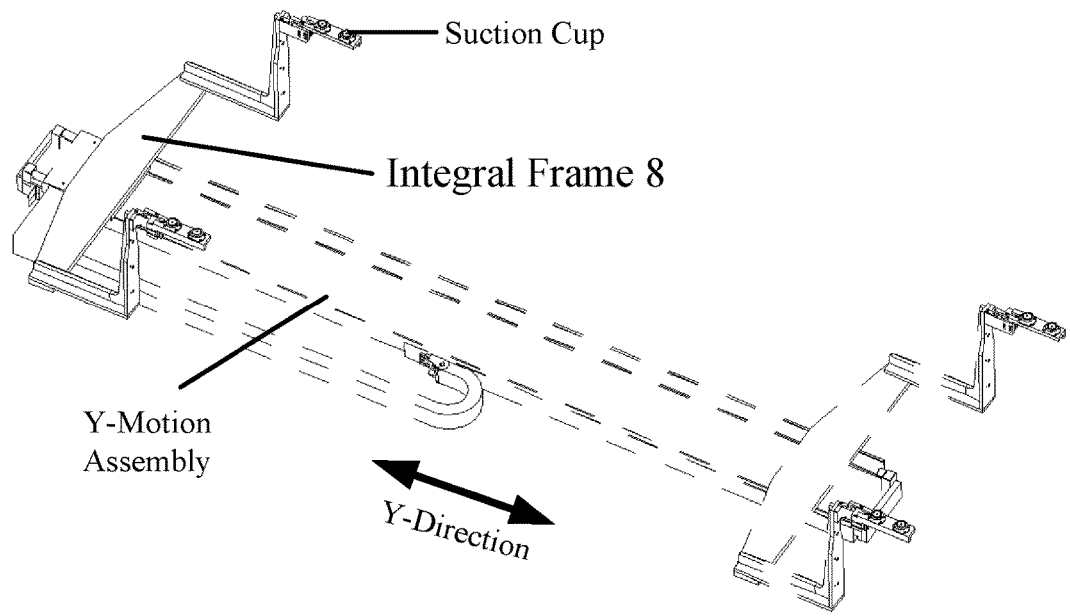
FIG. 1c is a perspective structural schematic diagram of a motion assembly according to the first embodiment of the present invention.
Figure 2:
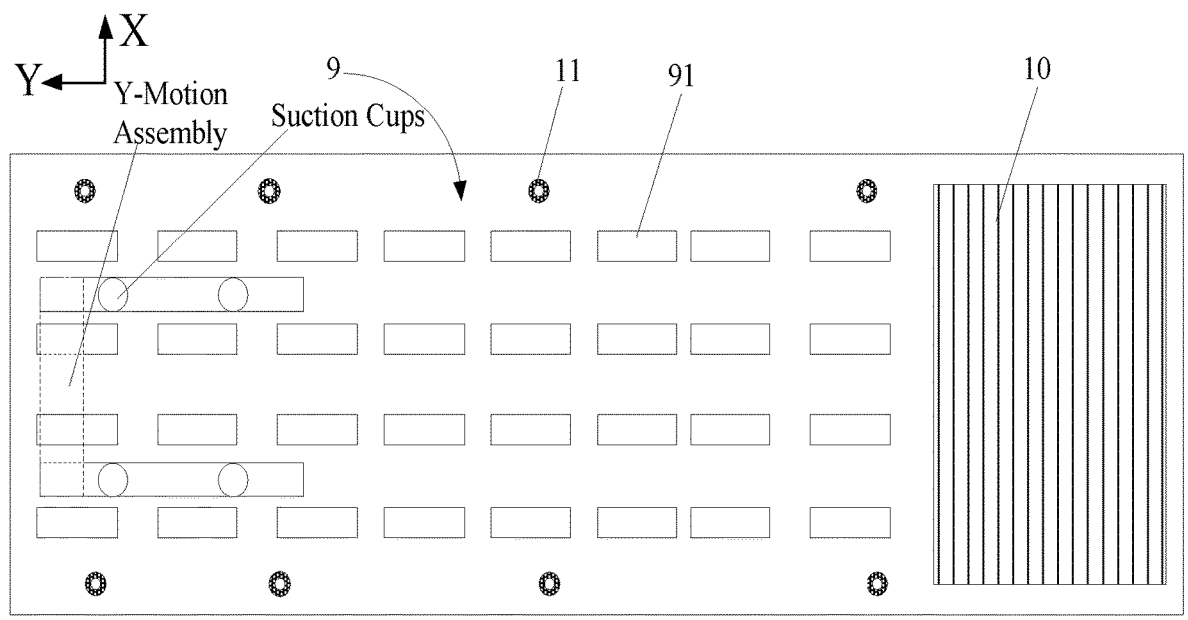
FIG. 2 is a front view of a substrate loading conveyor according to the first embodiment of the present invention.

Preferably, as shown in FIGS. 1c-2, the substrate transfer assembly includes a motion assembly (a Y-motion assembly as shown in the figures) and several suction cups provided on the motion assembly. The motion assembly may be attached to the integral frame 8. The substrate may be sucked onto the suction cups on the motion assembly so that when the motion assembly moves, the substrate moves with the motion assembly. Here, the movement refers to linear movement that can be realized by any of a variety of linear motion assemblies such as a motor/screw assembly. After the substrate 7 is transferred from the mechanical arm 1 onto the substrate loading conveyor 5, it is sucked onto the suction cups and driven by the motion assembly to move toward the wafer stage 2.

Figure 4A:
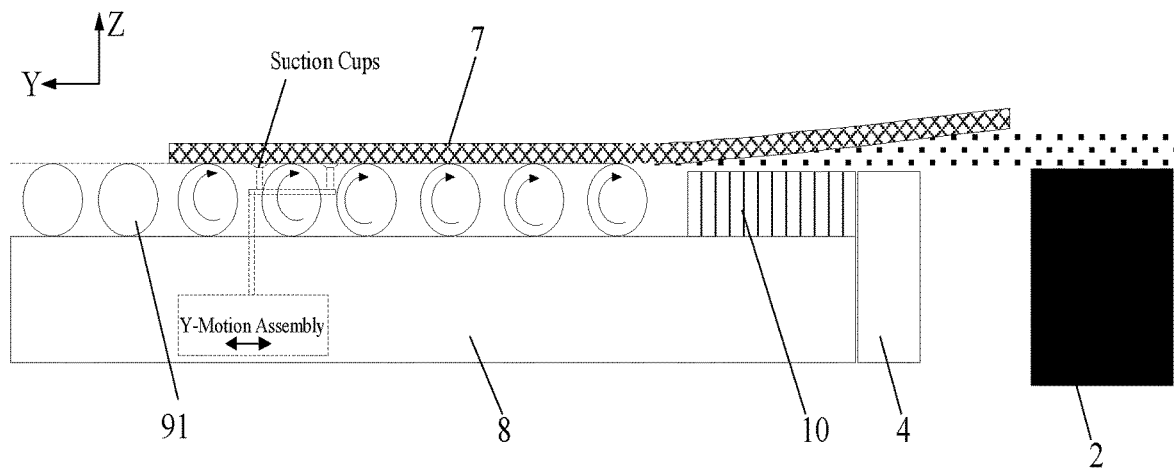
FIGS. 4a to 4b schematically show a substrate that is approaching a wafer stage in accordance with the first embodiment of the present invention.
Figure 4B:
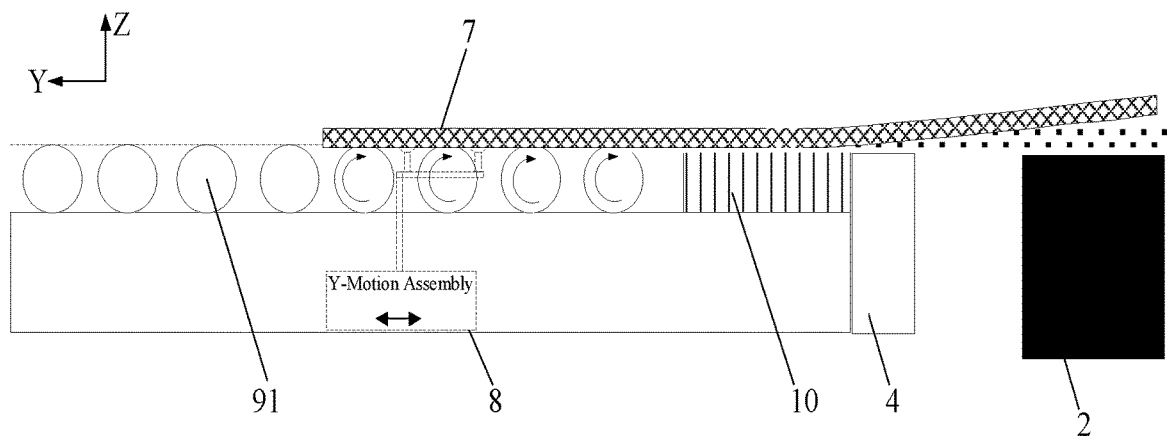

As shown in FIGS. 4a to 4b, the transition air suspension assembly 4 is disposed at the end of the integral frame 8 proximal to the wafer stage 2 and can engage with the substrate loading conveyor 5. When the substrate 7 approaches the end of the substrate loading conveyor 5 proximal to the wafer stage 2 without reaching the wafer stage 2, and preferably when the leading end of the substrate 7 reaches the transition air suspension assembly 4, an air film is generated by the transition air suspension assembly 4 to lift up the substrate 7, concurrently with the motion assembly continuing driving the substrate 7 toward the wafer stage 2 so that the substrate 7 is smoothly transferred onto the wafer stage 2.

As shown in FIGS. 1a to 3, the substrate conveyance assembly 3 is slidably supported on the integral frame 8. A rail extending in the X-direction is provided on the integral frame 8, and a mating groove is provided at the bottom of the substrate conveyance assembly 3. Depending on the design of the loading and unloading conveyors, the substrate conveyance assembly 3 may move in the X-direction relative to the integral frame 8 so that the substrate loading conveyor 5 or the substrate unloading conveyor 6 can be situated between the mechanical arm 1 and the wafer stage 2 at the position where it can engage and cooperate with the transition air suspension assembly 4. Each of the substrate loading conveyor 5 and the substrate unloading conveyor 6 includes a substrate guiding assembly 9 and a front-end air suspension assembly 10, which are sequentially arranged in the Y-direction and are vertically flush with each other. The substrate guiding assembly 9 includes a number of parallel guide roller rows each having several guide rollers 91 distributed along the X-direction at an interval. Specifically, the mechanical arm 1 may position the substrate 7 above the guide rollers 91 so that the substrate 7 can be sucked onto the suction cups of the substrate transfer assembly and driven by the motion assembly to move toward the wafer stage 2. Due to the moving substrate, the guide rollers 91 can rotate (clockwise as shown in the figures) and thereby guide the substrate 7. Good guidance of the guide rollers 91 enables the substrate 7 to move in the Y-direction without any lateral movement in the X-direction and hence ensures improved transfer accuracy.

Figure 3:
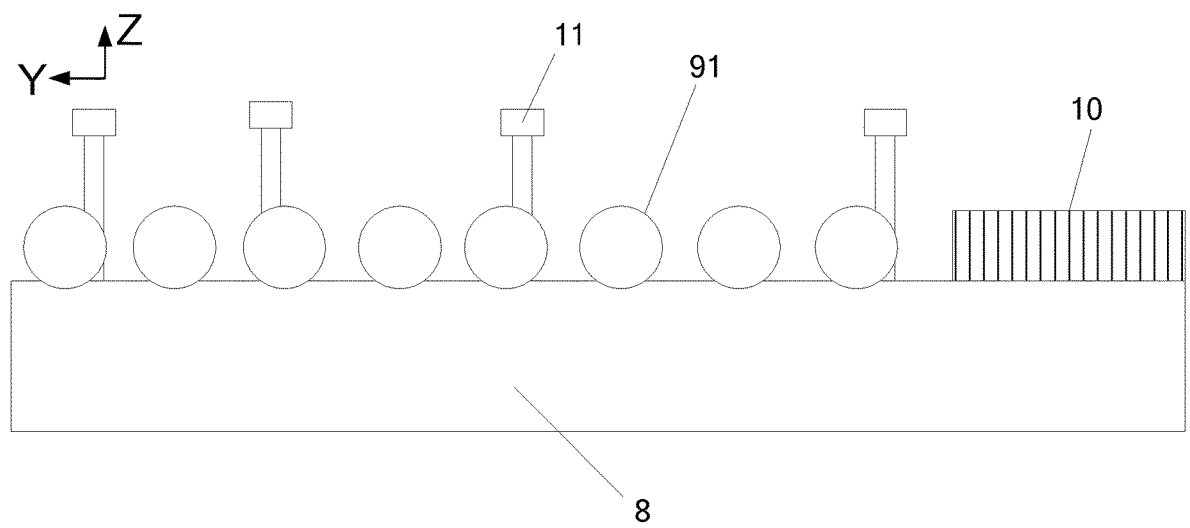
FIG. 3 is a side view of the substrate loading conveyor according to the first embodiment of the present invention.

With continued reference to FIGS. 2 to 3, the substrate loading conveyor 5 and the substrate unloading conveyor 6 also include respective edge protection assemblies disposed on respective sides of the substrate guiding assembly 9 in the X-direction. The edge protection assemblies include a number of T-shaped protrusions 11 arranged on both sides of the substrate guiding assembly 9 in the X-direction. In other words, the T-shaped protrusions 11 are arranged in two rows distributed along the Y-direction on the respective sides of the substrate guiding assembly 9. T-shaped protrusions 11 in each row are scattered along the Y-direction and protrude higher than the substrate guiding assembly 9 so as to protect the moving substrate 7 against any shift in the X-direction. This leads to a further improvement in transfer security.

The present invention also provides a substrate transfer method using the apparatus as defined above. The method includes the steps as set forth below.

In step S1, the mechanical arm 1 places the substrate 7 onto the substrate conveyance assembly 3. Specifically, in the context of this embodiment, only the substrate loading process is explained as an example. Accordingly, the substrate 7 is placed on the substrate loading conveyor 5 of the substrate conveyance assembly 3 so that the substrate 7 comes into contact with the guide rollers 91 of the substrate guiding assembly 9.

In step S2, the substrate 7 is sucked onto the substrate transfer assembly and is conveyed thereby toward the wafer stage 2. Specifically, the substrate 7 is sucked onto the suction cups of the substrate transfer assembly and is driven by the motion assembly to move toward the wafer stage 2. As a result of the movement of the substrate 7, the guide rollers 91 rotate clockwise and thereby provide guidance to the substrate 7. Good guidance of the guide rollers 91 enables the substrate 7 to move in the Y-direction without any lateral movement in the X-direction and hence ensures improved transfer accuracy. Through the whole process, the edge protection assemblies distributed on both sides of the substrate guiding assembly 9 in the X-direction prevent the substrate from moving laterally in the X-direction.

In step S3, when the substrate 7 approaches the end of the substrate conveyance assembly 3 proximal to the wafer stage 2, the transition air suspension assembly 4 produces an air film which levitates the substrate 7 and the motion assembly continues to drive the substrate 7 onto the wafer stage 2. It is to be noted that upon the substrate 7 approaching the end of the substrate conveyance assembly 3 proximal to the wafer stage 2, the front-end air suspension assembly 10 produces another air film which lifts up the substrate 7 and the substrate 7, under driven of the motion assembly, is moved to a position above the transition air suspension assembly 4. Subsequently or concurrently, the air film produced by the transition air suspension assembly 4 levitates the substrate 7 and the motion assembly continues to drive the substrate 7 onto the wafer stage 2.

Embodiment 2

Figure 5:
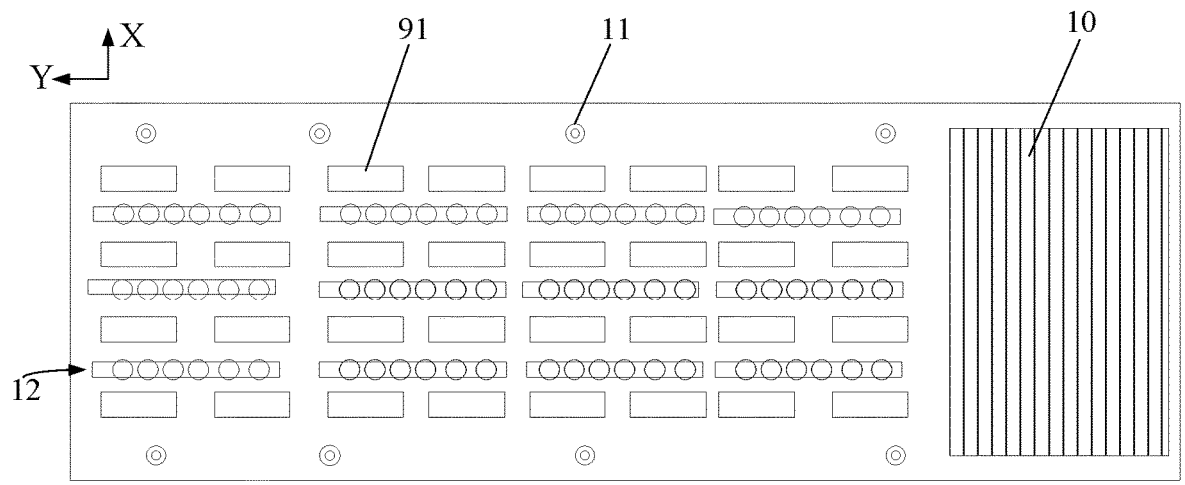
FIG. 5 is a front view of a substrate loading conveyor according to a second embodiment of the present invention.
Figure 6:
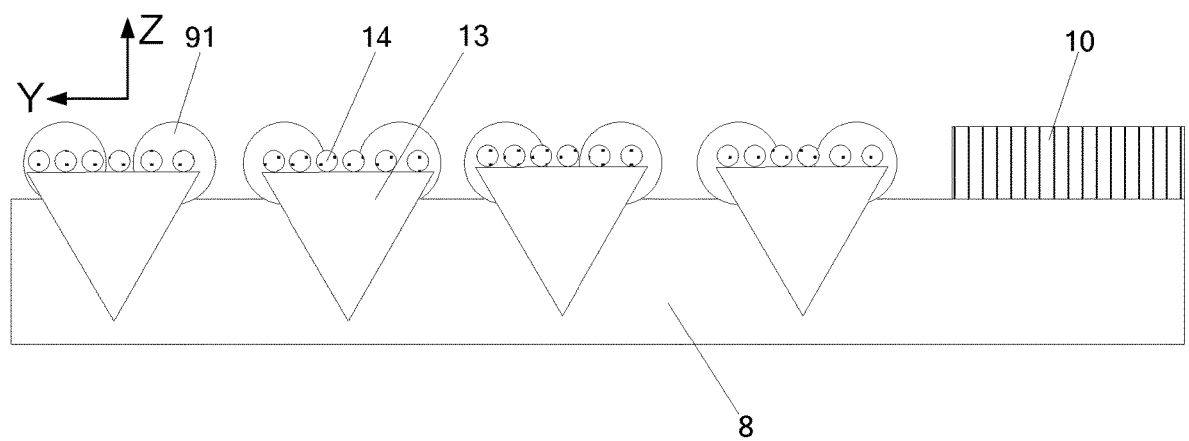
FIG. 6 is a side view of the substrate loading conveyor according to the second embodiment of the present invention.
Figure 7A:
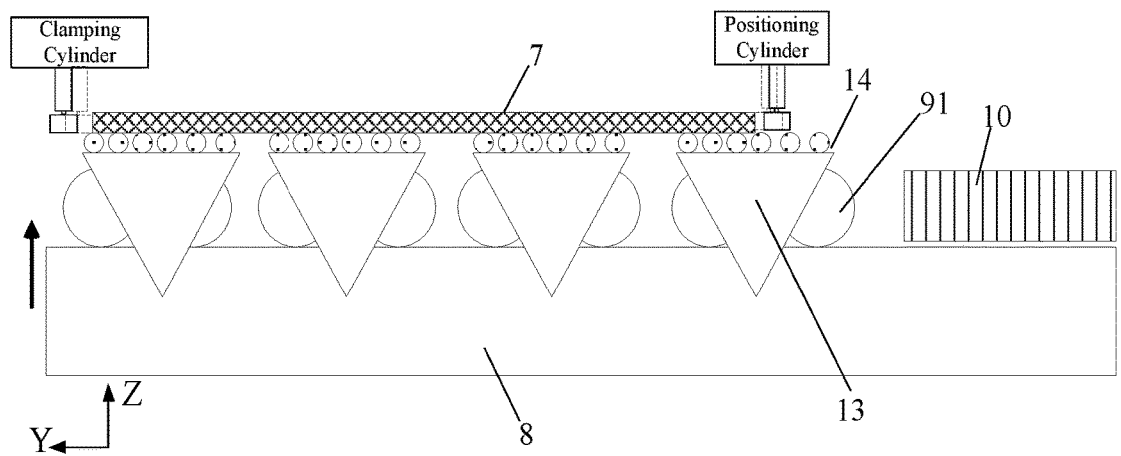
FIGS. 7a and 7b show a universal roller ball unit in upward and downward movements in accordance with the second embodiment of the present invention.
Figure 7B:
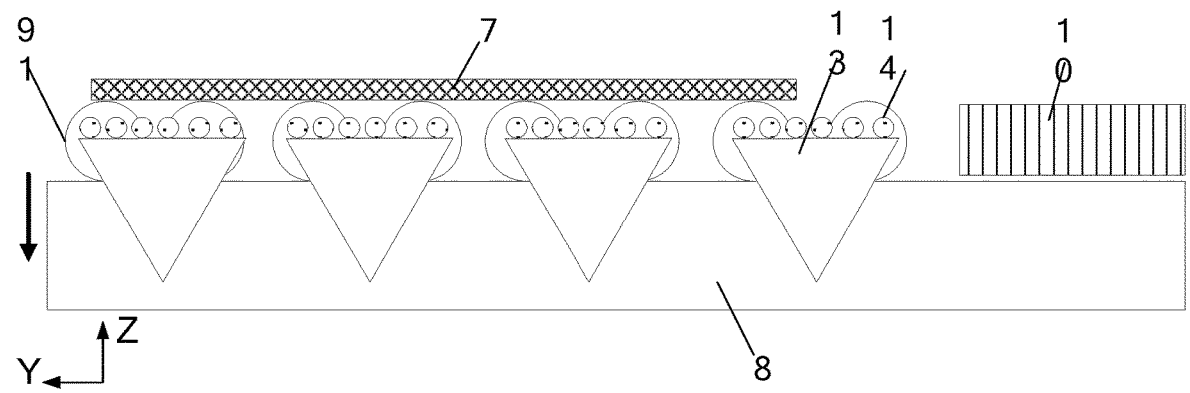

This embodiment differs from Embodiment 1 in that, as shown in FIGS. 5 to 6, the substrate loading conveyor 5 and the substrate unloading conveyor 6 further include a substrate position adjustment assembly interlacing with the substrate guiding assembly 9. Specifically, the substrate position adjustment assembly includes a number of universal roller ball groups interlaced between the guide roller rows. Each universal roller ball group includes a number of universal roller ball units 12 arranged along the X-direction at an interval. Each of the universal roller ball units 12 includes a support 13, a number of universal roller balls 14 disposed on the support 13 and a cylinder (not shown) configured to drive the support 13 to move up and down. The universal Roller balls 14 in each universal roller ball unit 12 are passively adapted to the adjustment of the substrate so as to prevent frictions occurring during the adjustment from damaging the substrate. Specifically, the supports 13 are fixed on the integral frame 8. Upon the placement of the substrate 7 onto the substrate conveyance assembly 3 by the mechanical arm 1, the cylinders of the universal roller ball units 12 cause the supports 13 to move upward so as to allow the substrate 7 to be placed on a plane defined by the universal roller ball units 12. Subsequently, under the action of positioning cylinders and clamping cylinders (as shown in FIG. 7a), the substrate will be driven to a target position within the plane defined by the universal roller ball units 12. With this done, the position adjustment process is completed. However, the present invention is not limited to this implementation. In this embodiment, the substrate is a rectangular substrate having four sides, two of which are provided with the positioning cylinders, and the remaining two sides with the clamping cylinders. The positioning cylinders are adapted to align the substrate during its placement, and the clamping cylinders are configured for position tuning thereof by moving the substrate. As shown in FIG. 7a, as the universal roller balls 14 can rotate in any direction, scratches are prevented during the adjustment. Following the position adjustment of the substrate 7, the cylinders cause the supports 13 to move downward, as shown in FIG. 7b, so that the substrate 7 again resides on the guide rollers 91 of the substrate conveyance assembly 3. After that, the suction cups of the substrate transfer assembly are caused to move upward by the cylinders and then activated for vacuum suction of the substrate 7. The motion assembly then drives the substrate transfer assembly to move toward the wafer stage 2 together with the substrate 7 sucked thereon. Due to the movement of the substrate, the guide rollers 91 rotate clockwise and thereby provide guidance to the substrate 7. Good guidance of the guide rollers 91 enables the substrate 7 to move in the Y-direction smoothly without any lateral movement in the X-direction and hence ensures improved transfer accuracy.

In summary, the present invention provides a substrate transfer apparatus and method. The apparatus includes a substrate conveyance assembly 3 and a transition air suspension assembly 4, both disposed between a mechanical arm 1 and a wafer stage 2. The substrate conveyance assembly 3 includes a substrate loading conveyor 5 and a substrate unloading conveyor 6, which are parallel to each other and both extend in the X-direction. Each of the substrate loading conveyor 5 and the substrate unloading conveyor 6 is provided with a substrate transfer assembly disposed at the end proximal to the mechanical arm 1. The substrate conveyance assembly 3 and the transition air suspension assembly 4 together form a transfer subsystem that is significantly reduced in cost and capable of efficient, secure transfer of a substrate 7 between the mechanical arm 1 and the wafer stage 2 by virtue of the cooperation between the transition air suspension assembly 4 and the guide rollers 91 during transfer of the substrate 7 between the substrate conveyance assembly 3 and the wafer stage 2.

Although several embodiments of the present invention have been described herein above, these embodiments are presented merely for the purpose of illustration and are not intended to limit the scope of the invention. Various omissions, substitutions and changes made without departing from the spirit of the invention are intended to be embraced within the scope thereof.

What is claimed is:

1. A substrate transfer apparatus, comprising:
   a substrate conveyance assembly disposed between a mechanical arm and a wafer stage, the substrate conveyance assembly comprising a substrate loading conveyor and a substrate unloading conveyor parallelly arranged in a first direction, each of the substrate loading conveyor and the substrate unloading conveyor configured for conveying a substrate between the wafer stage and the mechanical arm along a second direction that is perpendicular to the first direction;
   an integral frame; and
   a transition air suspension assembly fixed to the integral frame at an end thereof proximal to the wafer stage, the transition air suspension assembly being able to engage with either of the substrate loading conveyor and the substrate unloading conveyor and configured to produce an air film to levitate the substrate during the conveyance of the substrate by the substrate loading conveyor or the substrate unloading conveyor.

2. The substrate transfer apparatus of claim 1, wherein the substrate loading conveyor and the substrate unloading conveyor are fixed relative to each other and in slidable connection with the integral frame.

3. The substrate transfer apparatus of claim 1, wherein each of the substrate loading conveyor and the substrate unloading conveyor is provided with a substrate transfer assembly at an end thereof proximal to the mechanical arm.

4. The substrate transfer apparatus of claim 3, wherein each of the substrate transfer assembly of the substrate loading conveyor and the substrate transfer assembly of the substrate unloading conveyor comprises a motion assembly disposed on the integral frame and a plurality of suction cups disposed on the motion assembly, the plurality of suction cups being configured for sucking the substrate so that the substrate is able to be moved with the motion assembly in the second direction.

5. The substrate transfer apparatus of claim 4, wherein the motion assembly is implemented as a motor/screw assembly.

6. The substrate transfer apparatus of claim 1, wherein each of the substrate loading conveyor and the substrate unloading conveyor comprises a substrate guiding assembly and a front-end air suspension assembly, which are disposed along the second direction and are vertically flush with each other.

7. The substrate transfer apparatus of claim 6, wherein the substrate guiding assembly comprises a plurality of guide roller rows each comprising a plurality of guide rollers arranged along the second direction at an interval.

8. The substrate transfer apparatus of claim 6, wherein the front-end air suspension assembly is configured for producing another air film to levitate the substrate.

9. The substrate transfer apparatus of claim 7, wherein each of the substrate loading conveyor and the substrate unloading conveyor further comprises a substrate position adjustment assembly interlaced with the substrate guiding assembly.

10. The substrate transfer apparatus of claim 9, wherein the substrate position adjustment assembly comprises a plurality of universal roller ball groups interlaced with the plurality of guide roller rows, each of the plurality of universal roller ball groups comprising a plurality of universal roller ball units arranged along the second direction at an interval.

11. The substrate transfer apparatus of claim 10, wherein each of the plurality of universal roller ball units comprises a support, a plurality of universal roller balls disposed on the support and a cylinder for driving the support to move vertically.

12. The substrate transfer apparatus of claim 6, wherein each of the substrate loading conveyor and the substrate unloading conveyor further comprises edge protection assemblies disposed on both sides of the corresponding substrate guiding assembly in the first direction and configured to prevent any shift of the substrate in the first direction.

13. The substrate transfer apparatus of claim 12, wherein the edge protection assemblies comprise a plurality of T-shaped protrusions arranged on both sides of the corresponding substrate guiding assembly in the first direction.

14. The substrate transfer apparatus of claim 1, wherein the substrate loading conveyor and the substrate unloading conveyor have identical structures.

15. A substrate transfer method for use with the substrate transfer apparatus as defined in claim 1, comprising the steps of:
- S1) placing a substrate onto the substrate conveyance assembly by the mechanical arm;
- S2) sucking the substrate onto a substrate transfer assembly of the substrate loading conveyor and conveying the substrate by the substrate transfer assembly of the substrate loading conveyor toward the wafer stage; and
- S3) upon the substrate approaching the end of the substrate conveyance assembly proximal to the wafer stage, the transition air suspension assembly producing an air film to levitate the substrate and transferring the substrate by the substrate transfer assembly of the substrate loading conveyor onto the wafer stage along the second direction.

16. The substrate transfer method of claim 15, wherein in step S2, the substrate is sucked onto a plurality of suction cups of the substrate transfer assembly of the substrate loading conveyor and conveyed by the motion assembly toward the wafer stage, and wherein movement of the substrate drives a plurality of guide rollers of the substrate conveyance assembly to rotate and thereby guide the movement of the substrate.

17. The substrate transfer method of claim 15, wherein the substrate conveyance assembly further comprises a plurality of universal roller ball units arranged along the second direction at an interval, each of the plurality of universal roller ball units comprising a support, a plurality of universal roller balls disposed on the support and a cylinder for driving the support to move vertically, and wherein the substrate transfer method further comprises, between steps S1 and S2, driving the supports of the plurality of universal roller ball units to move upward by the cylinders of the plurality of universal roller ball units so that the substrate is positioned on a plane defined by the plurality of universal roller ball units and adjusted in position and driving the supports to move downward by the cylinders of the plurality of universal roller ball units so that the substrate again resides on the substrate conveyance assembly.

18. A substrate transfer method for use with the substrate transfer apparatus as defined in claim 1, comprising the steps of:
- S10) upon a substrate approaching the end of the substrate conveyance assembly proximal to the wafer stage, the transition air suspension assembly producing an air film to levitate the substrate and transferring the substrate from the wafer stage onto the substrate conveyance assembly by a substrate transfer assembly of the substrate unloading conveyor along the second direction;
- S20) sucking the substrate onto the substrate transfer assembly of the substrate unloading conveyor and conveying the substrate by the substrate transfer assembly of the substrate unloading conveyor toward the mechanical arm; and
- S30) removing the substrate from the substrate conveyance assembly by the mechanical arm.

\* \* \* \* \*